US012340331B2

(12) United States Patent
Nakayama et al.

(10) Patent No.: US 12,340,331 B2
(45) Date of Patent: Jun. 24, 2025

(54) INFORMATION PROCESSING DEVICE AND INFORMATION PROCESSING METHOD

(71) Applicant: FUJI CORPORATION, Chiryu (JP)

(72) Inventors: Yukinori Nakayama, Hekinan (JP); Mitsuaki Oiki, Anjo (JP)

(73) Assignee: FUJI CORPORATION, Chiryu (JP)

(*) Notice: Subject to any disclaimer, the term of this patent is extended or adjusted under 35 U.S.C. 154(b) by 497 days.

(21) Appl. No.: 17/906,419

(22) PCT Filed: Mar. 17, 2020

(86) PCT No.: PCT/JP2020/011730
§ 371 (c)(1),
(2) Date: Sep. 15, 2022

(87) PCT Pub. No.: WO2021/186552
PCT Pub. Date: Sep. 23, 2021

(65) Prior Publication Data
US 2023/0363131 A1    Nov. 9, 2023

(51) Int. Cl.
G06Q 10/0631    (2023.01)
G05B 19/418    (2006.01)
(Continued)

(52) U.S. Cl.
CPC . *G06Q 10/06316* (2013.01); *G05B 19/41845* (2013.01); *G05B 19/41865* (2013.01);
(Continued)

(58) Field of Classification Search
CPC ............. H05K 13/021; H05K 13/0452; H05K 13/0486; H05K 13/085; H05K 13/086;
(Continued)

(56) References Cited

U.S. PATENT DOCUMENTS 9,841,768 B2 * 12/2017 Hiramatsu ............ G01S 13/931
10,620,614 B2 *  4/2020 Nakazono ........ G05B 19/41865
(Continued)

FOREIGN PATENT DOCUMENTS

CN    110431928 8       6/2021
EP    3 567 997 A1     11/2019
(Continued)

OTHER PUBLICATIONS

International Search Report Issued Jun. 16, 2020, in PCT/JP2020/011730, filed on Mar. 17, 2020, 3 pages.

*Primary Examiner* — Crystal J Barnes-Bullock
(74) *Attorney, Agent, or Firm* — Oblon, McClelland, Maier & Neustadt, L.L.P.

(57) ABSTRACT

An information processing device of the present disclosure is used in a mounting system including multiple mounting-related devices each having a display section that visually notifies an operator of information and an attachment portion to which a member is attached and related to a process of mounting a component on a processing target object, and a moving work device that is moved between the multiple mounting-related devices to automatically attach and detach the member to and from the attachment portion. The information processing device includes a control section that outputs, to the display section, notification information including work details that are substitutable by the operator in association with a status of the moving work device based on a predetermined priority order based on continuation of processes of the mounting-related devices.

8 Claims, 6 Drawing Sheets

(51) Int. Cl.
  *G06Q 50/04* (2012.01)
  *H05K 13/04* (2006.01)
  *H05K 13/08* (2006.01)

(52) U.S. Cl.
  CPC ... *G05B 19/4189* (2013.01); *G06Q 10/06312* (2013.01); *G06Q 10/06313* (2013.01); *G06Q 50/04* (2013.01); *H05K 13/0486* (2013.01); *H05K 13/0882* (2018.08)

(58) Field of Classification Search
  CPC .......... H05K 13/0882; H05K 13/0888; G05B 19/418; G05B 19/4815; G05B 19/41845; G05B 19/41865; G05B 19/4187; G05B 19/4189; G06Q 10/06312; G06Q 10/06313; G06Q 10/06316; G06Q 50/04
  USPC ............... 700/101, 105, 112; 705/7.22, 7.26
  See application file for complete search history.

(56) References Cited

U.S. PATENT DOCUMENTS

| | | | |
|---|---|---|---|
| 11,100,441 B2* | 8/2021 | Nonoyama | G06Q 10/06311 |
| 11,653,486 B2* | 5/2023 | Matsushita | H05K 13/0419 |
| | | | 29/739 |
| 11,943,873 B2* | 3/2024 | Kinoshita | H05K 13/0882 |
| 12,120,826 B2* | 10/2024 | Muraoka | H05K 13/087 |
| 2006/0200264 A1* | 9/2006 | Kodama | G06Q 10/087 |
| | | | 700/121 |

FOREIGN PATENT DOCUMENTS

| | | | | |
|---|---|---|---|---|
| JP | 2002-190700 A | | 7/2002 | |
| JP | 3717801 B2 | * | 11/2005 | |
| JP | 3784772 B2 | * | 6/2006 | |
| JP | WO2020/026379 A1 | | 2/2020 | |
| JP | 6689323 B2 | * | 4/2020 | ........... G05B 19/418 |
| JP | 7163393 B2 | * | 10/2022 | ........... H05K 13/021 |
| WO | WO-2004103052 A1 | * | 11/2004 | ......... H05K 13/0452 |
| WO | WO 2005/009101 A1 | | 1/2005 | |
| WO | WO-2015166538 A1 | * | 11/2015 | ........... G05B 19/418 |
| WO | WO 2018/173204 A1 | | 9/2018 | |
| WO | WO-2020039541 A1 | * | 2/2020 | ........... G05B 19/042 |
| WO | WO-2020039543 A1 | * | 2/2020 | ........... H05K 13/021 |

* cited by examiner

INFORMATION PROCESSING DEVICE AND INFORMATION PROCESSING METHOD

TECHNICAL FIELD

The present specification discloses an information processing device and an information processing method.

BACKGROUND ART

In the related art, there has been proposed a mounting system that includes a component mounter and a unit exchange device (moving work device) automatically replacing a component supply unit of the component mounter based on an instruction list, outputting an instruction for replacing a component supply unit in a manner recognizable by an operator, and in a case where the component supply unit is attached to or detached from the component mounter, when it is determined that an attachment/detachment instruction is satisfied, deletes the corresponding attachment/detachment instruction and performs an update process of an instruction list (refer to Patent Literature 1, for example). In this mounting system, cooperative work including the replacement by the operator and the replacement by the moving work device can be appropriately performed.

Patent Literature

Patent Literature 1: International Publication No. WO2018/173204

BRIEF SUMMARY

Technical Problem

Incidentally, in the mounting system in Patent Literature 1 described above, the cooperative work between the operator and the moving work device is appropriately performed by updating the instruction list, but since the operator checks the instruction list to be operated by the moving work device, it is still not possible to ascertain which work is to be performed with higher priority. In such a mounting system, it has been demanded that an operator prompt cooperative work including replacement by the operator and replacement by a moving work device.

The present disclosure has been made in view of such problems, and a principal object of the present disclosure is to provide an information processing device and an information processing method capable of an operator prompting cooperative work including replacement by the operator and replacement by a moving work device.

Solution to Problem

The present disclosure employs the following means in order to achieve the above principal object.

According to the present disclosure, there is provided an information processing device used in a mounting system including multiple mounting-related devices each having a display section configured to visually notify an operator of information and an attachment portion to which a member is attached and related to a process of mounting a component on a processing target object, and a moving work device that is moved between the multiple mounting-related devices to automatically attach and detach the member to and from the attachment portion, the information processing device including a control section configured to output, to the display section, notification information including work details that are substitutable by the operator in association with a status of the moving work device based on a predetermined priority order based on continuation of processes of the mounting-related devices.

In the information processing device, the notification information including work details that are substitutable by the operator in association with a status of the moving work device is output to the display section based on a predetermined priority order based on continuation of processes of the mounting-related devices. The operator can perform work by checking pieces of notification information arranged in the priority order. Therefore, in this information processing device, the operator can prompt cooperative work including replacement by the operator and replacement by the moving work device. Here, the mounting-related device includes, for example, a printing device that prints a viscous fluid on a processing target object, a print inspection device that inspects a printing state or the like, a mounting device that performs a process of mounting a component, a mounting inspection device that inspects a mounting state or the like, a storage device that stores members used in the device, a conveyance device for a processing target object, and a reflow device for performing a reflow process. Examples of the processing target object include a board and a base material having a three-dimensional structure.

DESCRIPTION OF EMBODIMENTS

Figure 1:
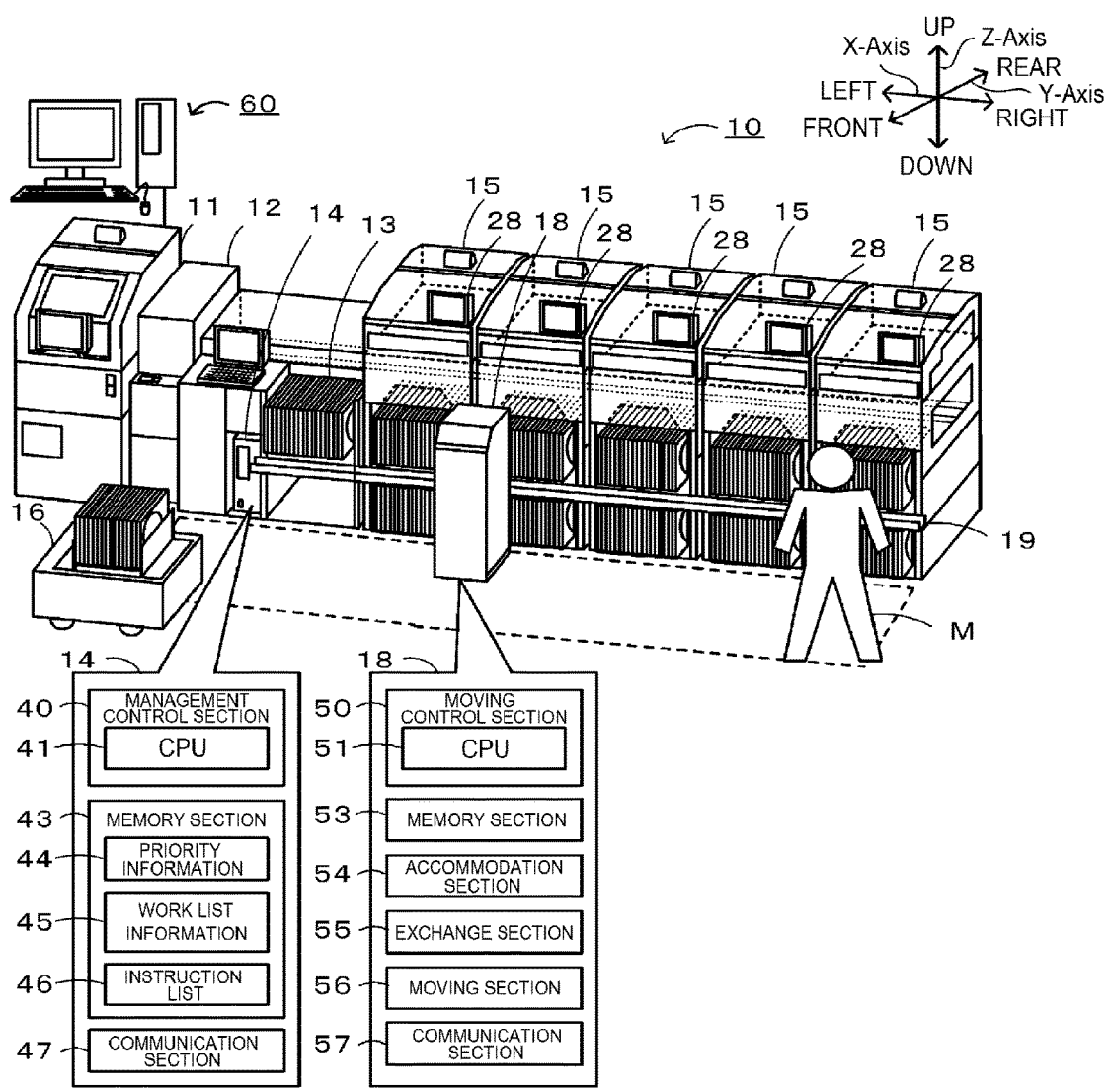
FIG. 1 is a schematic explanatory diagram illustrating an example of mounting system 10.
Figure 2:
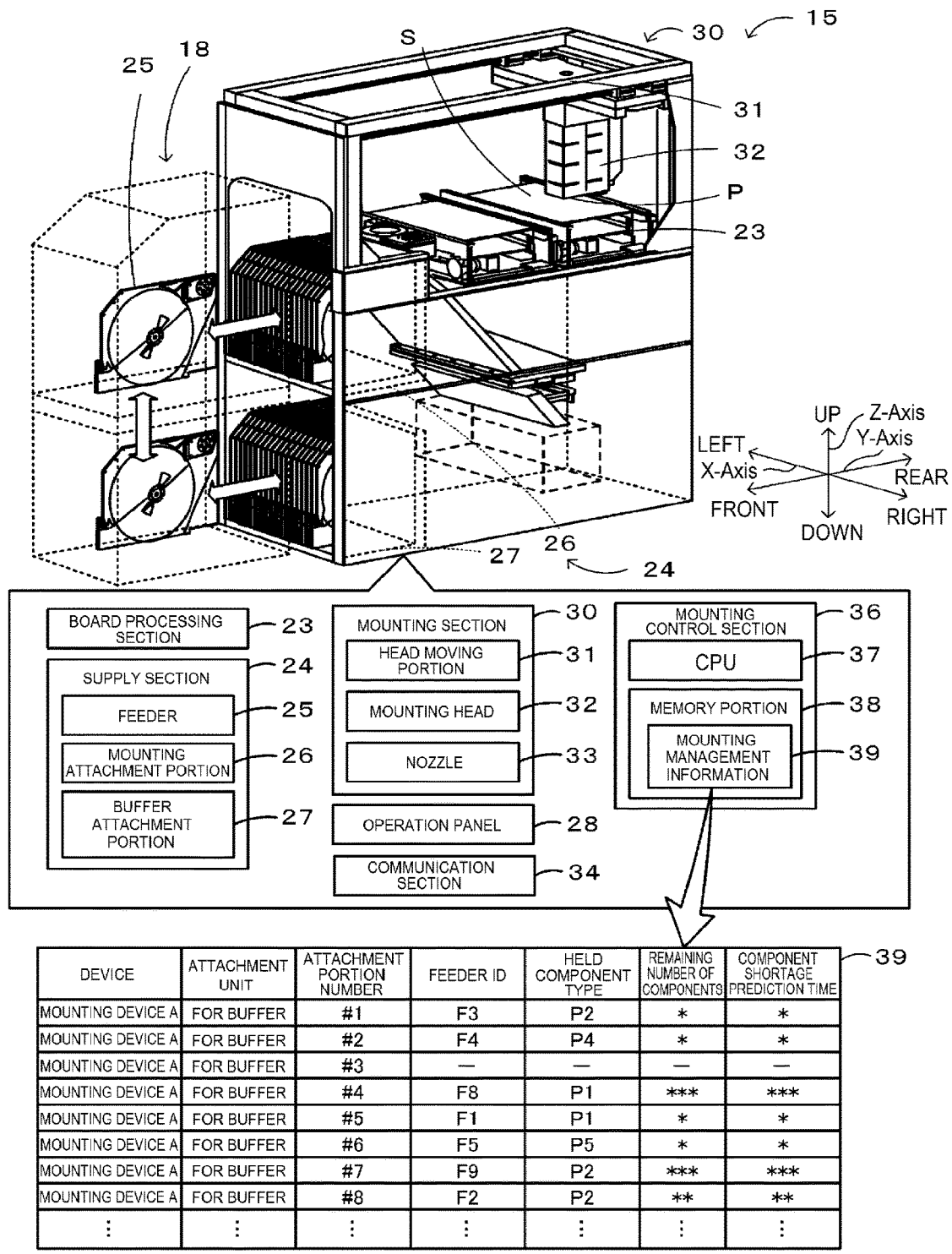
FIG. 2 is an explanatory diagram schematically illustrating a configuration of mounting device 15.
Figure 3:
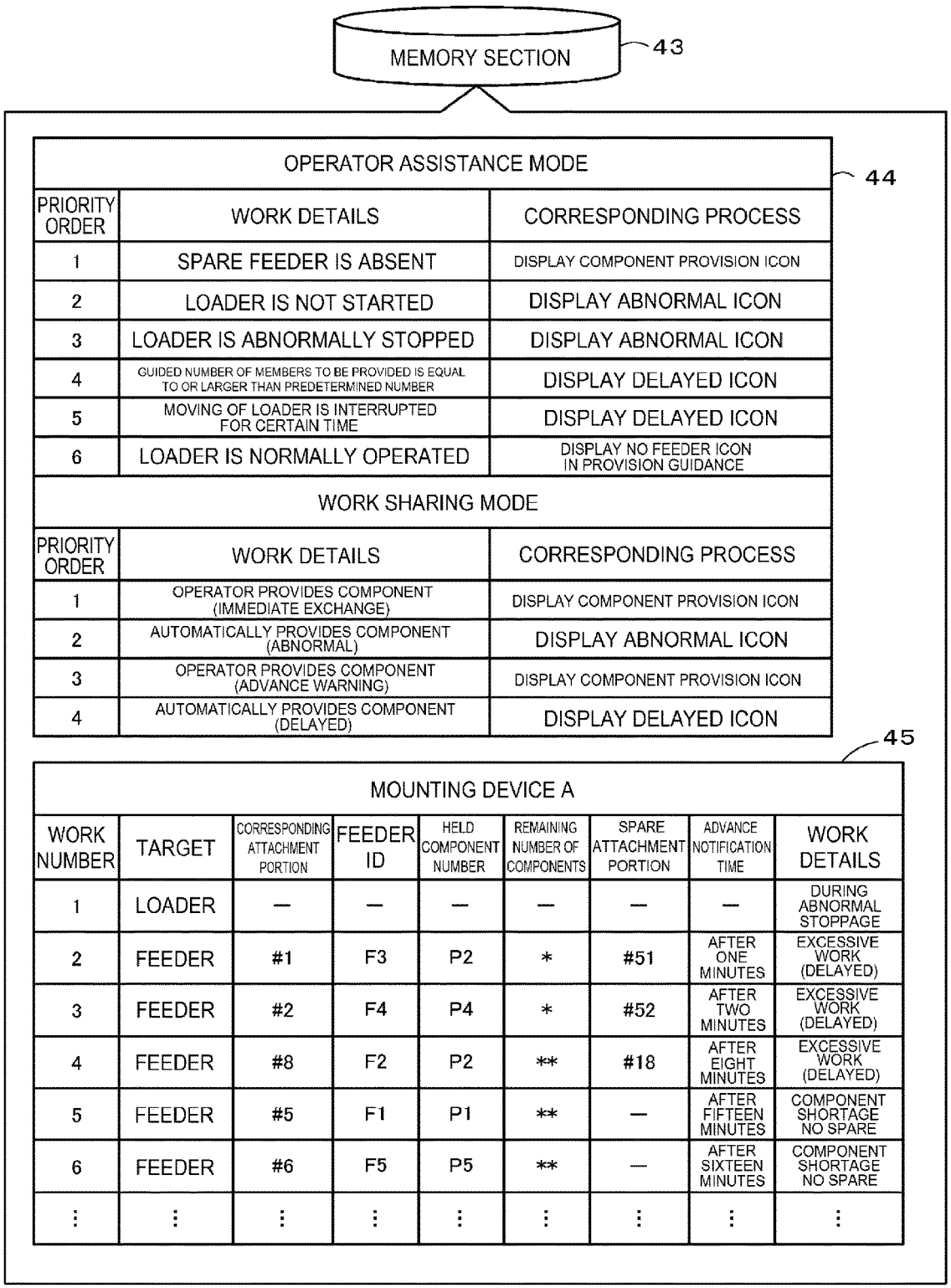
FIG. 3 is an explanatory diagram illustrating priority information 44 and work list information 45 stored in memory section 43.

Hereinafter, the present embodiment will be described with reference to the drawings. FIG. 1 is a schematic explanatory diagram illustrating an example of mounting system 10 of the present disclosure. FIG. 2 is an explanatory diagram schematically illustrating an outline of a configuration of mounting device 15. FIG. 3 is an explanatory diagram of priority information 44 and work list information 45 stored in memory section 43. In the present embodiment, a left-right direction (X-axis), a front-rear direction (Y-axis), and an up-down direction (Z-axis) are as illustrated in FIGS. 1 and 2.

Mounting system 10 is configured, for example, as a production line in which mounting devices 15 performing a process of mounting components P on board S serving as a processing target object are arranged in a conveyance direction of board S. Here, a processing target object will be described as board S, but the processing target object is not particularly limited as long as it is a board on which component P is mounted, and may be a base material having a three-dimensional shape. As illustrated in FIG. 1, mounting system 10 includes printing device 11, print inspection device 12, storage section 13, management PC 14, mounting device 15, a mounting inspection device (not illustrated), a reflow device (not illustrated), automatic conveyance vehicle 16, loader 18, host PC 60, and the like. Printing device 11 is a device that prints a solder paste or the like on board S. Print inspection device 12 is a device that inspects a state of the printed solder. The mounting inspection device is a device that inspects a state or the like of a component that has been subjected to a mounting process. The reflow device is a device that reflows a board on which a solder is printed and on which a component is mounted. Host PC 60 is configured as a server that stores and manages information used by each device of mounting system 10, such as a production plan database including multiple pieces of mounting condition information.

Mounting device 15 is a device that picks up component P and mounts component P on board S. As illustrated in FIG. 2, mounting device 15 includes board processing section 23, component supply section 24, operation panel 28, mounting section 30, mounting control section 36, and communication section 34.

Board processing section 23 is a unit that carries in, conveys, fixes board S at a mounting position, and carries out board S. Component supply section 24 is a unit that supplies component P to mounting section 30. Component supply section 24 attaches feeder 25 including a reel around which a tape serving as a holding member holding component P is wound to at least one attachment portion. Component supply section 24 includes a mounting attachment portion 26 to which feeder 25 used for a mounting process is attached and buffer attachment portion 27 to which spare feeder 25 is attached in an upper and lower stage. Here, the mounting attachment portion 26 and buffer attachment portion 27 will be collectively referred to as an attachment portion. Feeder 25 includes a controller (not illustrated). The controller stores information such as an ID of a tape included in feeder 25, and the type and the remaining number of components P. When feeder 25 is attached to the attachment portion, the controller transmits the information of feeder 25 to mounting control section 36. Component supply section 24 may include a tray unit having a tray as a holding member on which multiple components P are arranged and placed. Operation panel 28 is configured as a touch panel having functions of a display section displaying a screen and an operation section receiving an input operation from an operator, and displays an operation state and a setting state of mounting device 15 on a screen. Communication section 34 is an interface that exchanges information with external devices such as management PC 14, loader 18, and host PC 60.

Mounting section 30 is a unit that picks up component P from component supply section 24 and disposes component P on board S fixed to board processing section 23. Mounting section 30 includes head moving portion 31, mounting head 32, and nozzle 33. Head moving portion 31 includes a slider that is moved in the XY-directions while being guided by a guide rail, and a motor driving the slider. Mounting head 32 picks up one or more components P and is moved in the XY-directions by head moving portion 31. Mounting head 32 is detachably attached to the slider. One or more nozzles 33 are detachably attached to a lower surface of mounting head 32. Nozzle 33 picks up component P by using a negative pressure. A pickup member that picks up component P may be a mechanical chuck or the like that mechanically holds component P in addition to nozzle 33.

Mounting control section 36 is configured as a microprocessor centered on CPU 37, and controls the entire device. Mounting control section 36 has memory portion 38. Memory portion 38 stores mounting condition information (production job) including information such as information of components P, an arrangement order in which components P are mounted on board S, an arrangement position, and an attachment position of feeder 25 from which components P are picked up, mounting management information 39, and the like. Mounting management information 39 includes information regarding the status of the current mounting process, such as the type (ID) of feeder 25 attached to mounting attachment portion 26, buffer attachment portion 27, or the like, the type of component to be supplied, the remaining number of components, the predicted time during which component shortage will occur, and information regarding the state of each unit of mounting device 15. Mounting management information 39 is periodically updated by CPU 37 as to a usage status of feeder 25 in accordance with consumption of components by mounting section 30, replacement of feeder 25 by loader 18 or operator M, or the like. The predicted time of a component shortage may be obtained, for example, by obtaining a component consumption rate (components/minute) per unit time, and using the component consumption rate and the current remaining number of components. Mounting control section 36 outputs control signals to board processing section 23, component supply section 24, operation panel 28, and mounting section 30, and receives signals from board processing section 23, component supply section 24, operation panel 28, and mounting section 30.

Storage section 13 is a storage place for temporarily storing feeder 25 used in mounting device 15. Storage section 13 is provided under a conveyance device between print inspection device 12 and mounting device 15. Storage section 13 has an attachment portion in the same manner as component supply section 24. When feeder 25 is connected to the attachment portion, the controller of feeder 25 outputs information regarding feeder 25, and management PC 14 receives the output information. In storage section 13, feeder 25 may be transported by automatic conveyance vehicle 16 or feeder 25 may be transported by an operator. Automatic conveyance vehicle 16 automatically conveys feeder 25, a member used in mounting system 10, and the like between a warehouse (not illustrated) and storage section 13. The warehouse stores feeder 25, other members, and the like.

Loader 18 is a mobile work device, which moves in a moving region in front of mounting system 10 (refer to dashed lines in FIG. 1), and is a device automatically attaching and detaching, collecting and providing members necessary for a mounting process, such as feeder 25 of mounting device 15. Loader 18 includes moving control section 50, memory section 53, accommodation section 54, exchange section 55, moving section 56, and communication section 57. Moving control section 50 is configured as a microprocessor centered on CPU 51 and controls the entire device. Moving control section 50 controls the entire device such that feeder 25 is collected from component supply section 24 or feeder 25 is provided to component supply section 24, and feeder 25 is moved to and from storage section 13. Memory section 53 is, for example, an HDD that stores various data such as a processing program. Accommodation section 54 has an accommodation space for accommodating feeder 25. Accommodation section 54 is configured to accommodate, for example, four feeders 25. Exchange section 55 is a mechanism that moves feeder 25 in and out as well as moving feeder 25 in the up-down direction (refer to FIG. 2). Exchange section 55 has a clamp portion that clamps feeder 25, a Y-axis slider that moves the clamp portion in the Y-axis direction (front-rear direction), and a Z-axis slider that moves the clamp portion in the Z-axis direction (up-down direction). Exchange section 55 executes attachment and detachment of feeder 25 at mounting attachment portion 26, and attachment and detachment of feeder 25 at buffer attachment portion 27. Moving section 56 is a mechanism that moves loader 18 in the X-axis direction (left-right direction) along X-axis rail 19 disposed in front of mounting device 15. Communication section 57 is an interface that exchanges information with external devices such as management PC 14 and mounting device 15. Loader 18 outputs the current position or executed work details to management PC 14. Loader 18 is capable of collecting and providing feeder 25, but may be configured to collect and provide members related to the mounting process, such as mounting head 32, nozzle 33, a solder cartridge, a screen mask, and a backup pin for supporting a board.

Management PC 14 is a device that manages loader 18 and feeder 25. Management PC 14 includes management control section 40, memory section 43, and communication section 47. Management control section 40 is configured as a microprocessor centered on CPU 41 and controls the entire device. Memory section 43 stores priority information 44, work list information 45, instruction list 46, and the like. Communication section 47 is an interface that exchanges information with external devices such as mounting device 15, loader 18, and host PC 60. Management PC 14 acquires information regarding the current position and the current state from loader 18 at predetermined time intervals, and stores the information in work list information 45.

Here, the information stored in memory section 43 will be described. Priority information 44 is information regarding the priority order in the work executed by the operator. Priority information 44 includes, for example, work details that operator M can perform in place of loader 18 and priority orders of work details that operator M is required to perform, which are set in advance such that processes of mounting device 15 are continued as much as possible. Mounting system 10 is configured to be able to execute cooperative work including automatic attachment and detachment of feeder 25 by loader 18 and manual attachment and detachment of feeder 25 by operator M. In mounting system 10, as the cooperative work, an operator assistance mode in which loader 18 basically performs an exchange operation for feeder 25 and operator M assists the exchange operation of loader 18 in a mounting process, and a work sharing mode in which an exchange operation of loader 18 and an exchange operation of operator M are independently assigned are defined. The work sharing mode is, for example, a mode in which operator M manually replaces feeder 25 that cannot be physically replaced by loader 18.

As illustrated in FIG. 3, priority information 44 defines the priority order of work in the operator assistance mode and the priority order of work in the work sharing mode. The priority order in the operator assistance mode is set in the order of absence of spare feeder 25 (impossible information), non-start of loader 18 (stop information), abnormal stoppage of loader 18 (stop information), excessive work (delay information) in which a guided number of members to be provided is equal to or larger than a predetermined allowable number, interruption of movement of loader 18 (interruption information), and a normal operation of loader 18. The absence of spare feeder 25 is a state in which spare feeder 25 is not present in a spare attachment portion (for example, buffer attachment portion 27), and this state is canceled when operator M replenishes spare feeder 25. The non-start of loader 18 is a state in which the power supply of loader 18 is off, and this state is canceled when operator M turns on the power supply. The abnormal stoppage of loader 18 is a state in which some abnormality has occurred in loader 18, and this state is canceled when operator M restarts loader 18 or removes the abnormality. The excessive work state is a state in which an amount of work that loader 18 can perform per unit time is exceeded, and thus a time delay occurs. This state is canceled by operator M manually replacing feeder 25 in advance. The interruption of movement of loader 18 is a state in which loader 18 is stopped for a predetermined time period (for example, several tens of seconds) when an obstacle including operator M is detected within a movement range of loader 18, and this state is canceled when operator M removes the obstacle. The priority order in the operator sharing mode is set in the order of immediate manual replacement by operator M (immediate exchange information), abnormality of loader 18 (abnormality information), an advance warning of operator M (warning information), and work delay of loader 18 (delay information). The immediate manual replacement by operator M is a state in which a component shortage has already occurred in feeder 25 assigned to be replaced by operator M, and the state is canceled when operator M manually replaces feeder 25. The abnormal state of loader 18 is a state in which loader 18 is not started or abnormally stopped, and this state is canceled when operator M performs any of power on, restart, and removal of the abnormality with respect to loader 18. The advance warning state of operator M is a state of providing a notification of an expectation that feeder 25 to be replaced by operator M will be subjected to component shortage after a predetermined time elapses from the present time. When feeder 25 is manually replaced before a predetermined time elapses, this state is canceled. The delay state of loader 18 is caused by a state in which an amount of work that can be performed per unit time is exceeded or movement of loader 18 is interrupted. When operator M manually replaces feeder 25 in advance or removes an obstacle from the movement range of loader 18, this state is canceled. The priority order is set in priority information 44 such that the processes of mounting system 10 are continued without being stopped as much as possible.

Work list information 45 is information including a state of loader 18, details of work executed by loader 18 on specific mounting device 15. Work list information 45 includes information regarding each mounting device 15 that is a work target of loader 18 in association with corresponding device. Work list information 45 includes information such as a work number, a work target, a number of a corresponding attachment portion to perform the work, an ID of feeder 25, the type of held component, a remaining number of components, a number of a spare attachment portion in which spare feeder 25 is served in advance, an advance notification time for executing work, and work details. Instruction list 46 is information including commands regarding moving exchange of feeder 25 executed by loader 18. Instruction list 46 includes list of work executed by loader 18. The instruction list includes extracted work that is executed by loader 18 included in work list information 45, and includes information such as an attachment position and the work order of feeder 25 to be collected or provided. Management control section 40 periodically collects information from loader 18 and mounting device 15, and updates work list information 45 and instruction list 46.

Next, an operation of mounting system 10 of the present embodiment configured as described above, first, a process in which mounting device 15 mounts component P on board S will be described. When the mounting process is started, CPU 37 of mounting control section 36 controls board processing section 23 to carry in and fix board S. Next, CPU 37 reads mounting condition information, causes mounting head 32 to pick up component P from feeder 25 attached to component supply section 24 based on the mounting condition information, and performs a process of disposing component P on board S. When component P is disposed on board S, CPU 37 causes board S to be discharged to board processing section 23, and thus the next board S is carried into board processing section 23 as described above. CPU 37 manages the number of components consumed by each feeder 25 during the execution of the mounting process, and when a remaining number of components is equal to or less than a predetermined warning value, transmits the information to management PC 14. Management PC 14 performs, for example, a process of adding an exchange operation for feeder 25 close to component shortage to work list information 45. Management PC 14 creates instruction list 46 from work list information 45, and causes loader 18 to execute an exchange operation based on instruction list 46. Loader 18 is moved between storage section 13 and mounting device 15 along X-axis rail 19, and executes a replacement process for feeder 25 in mounting device 15 that is a work target.

Figure 4:
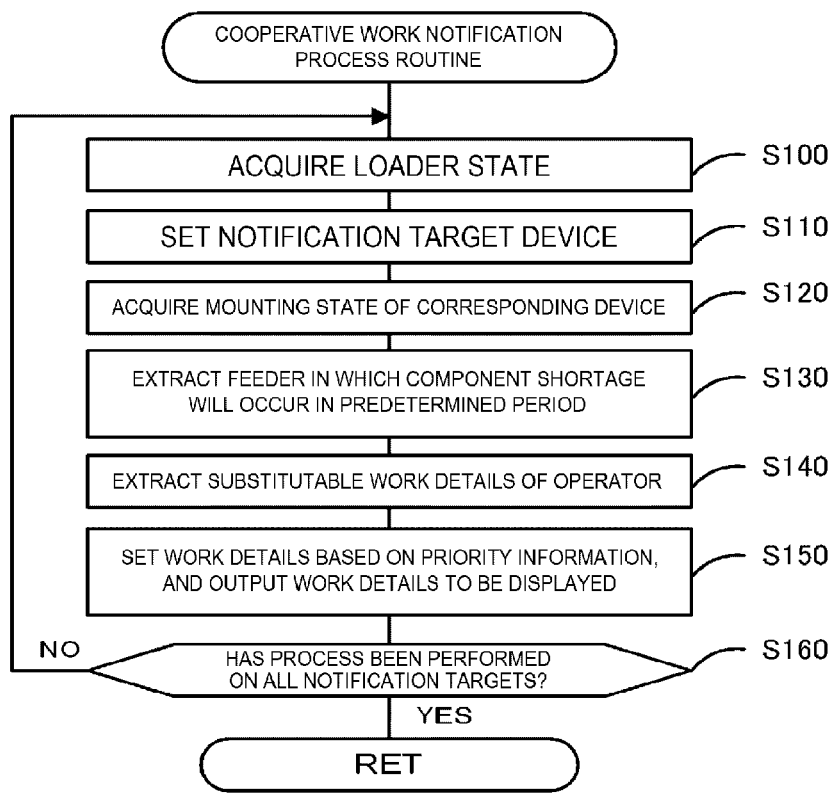
FIG. 4 is a flowchart illustrating an example of a cooperative work notification process routine.

Next, a process of notifying operator M of details of work to be preferentially performed will be described. FIG. 4 is a flowchart illustrating an example of a cooperative work notification process routine executed by management control section 40 of management PC 14. This routine is stored in memory section 43 of management PC 14, and is executed at predetermined intervals (for example, one minute) after management PC 14 is started. First, a notification process in the operator assistance mode in which operator M assists work of loader 18 will be described. When this routine is started, CPU 41 of management control section 40 acquires a state of loader 18 from loader 18 (S100), sets mounting device 15 that is a notification target (S110), and acquires the current mounting state by acquiring mounting management information 39 from mounting device 15 that is a notification target (S120). CPU 41 may set mounting devices 15 that is a notification target in the order of arrangement of the mounting systems 10. Here, CPU 41 acquires a state of the device directly from loader 18 or mounting device 15, but may acquire the state from work list information 45 that is periodically updated.

Next, CPU 41 extracts feeder 25 in which a component shortage will occur in a predetermined period S130. The predetermined period may be, for example, a range in which the occurrence of a component shortage or the like can be accurately predicted, a range which is good from the preparation of work to execution of the work, or a range which is not too long, and may be set to 30 minutes, one hour, or the like. Next, CPU 41 extracts substitutable work details of operator M from work on loader 18 and work related to replacement of feeder 25 S140. CPU 41 extracts work details after a predetermined time period during which loader 18 cannot start work at a scheduled work time as substitutable work details of operator M. CPU 41 excludes work executed by loader 18 within a predetermined short time period (for example, within 5 minutes) from the present time from the substitutable work details of operator M. CPU 41 excludes, for example, an exchange operation for spare feeder 25 accommodated in accommodation section 54 of loader 18, feeder 25 to be automatically replaced immediately after loader 18 is restored from a stop state, and the like from the substitutable work details of operator M. The reason why such an operation is excluded is that an effect of operator M performing substitute work is low. Subsequently, CPU 41 sets a display order for the extracted work details based on priority information 44, and outputs notification information and a display command for displaying the work details on a screen in the set display order to mounting device 15 (S150). CPU 41 determines whether the above process has been performed on all the notification target mounting devices 15 (S160), and when the process has not been completed on all the notification target mounting devices 15, the processes in and after S100 are repeatedly executed. That is, in step S110, the next mounting device 15 is set, and work details for mounting device 15 are displayed on mounting device 15 in the display order based on priority information 44. On the other hand, when the above process has been performed on all the notification target mounting devices 15, CPU 41 ends the routine.

Figure 5:
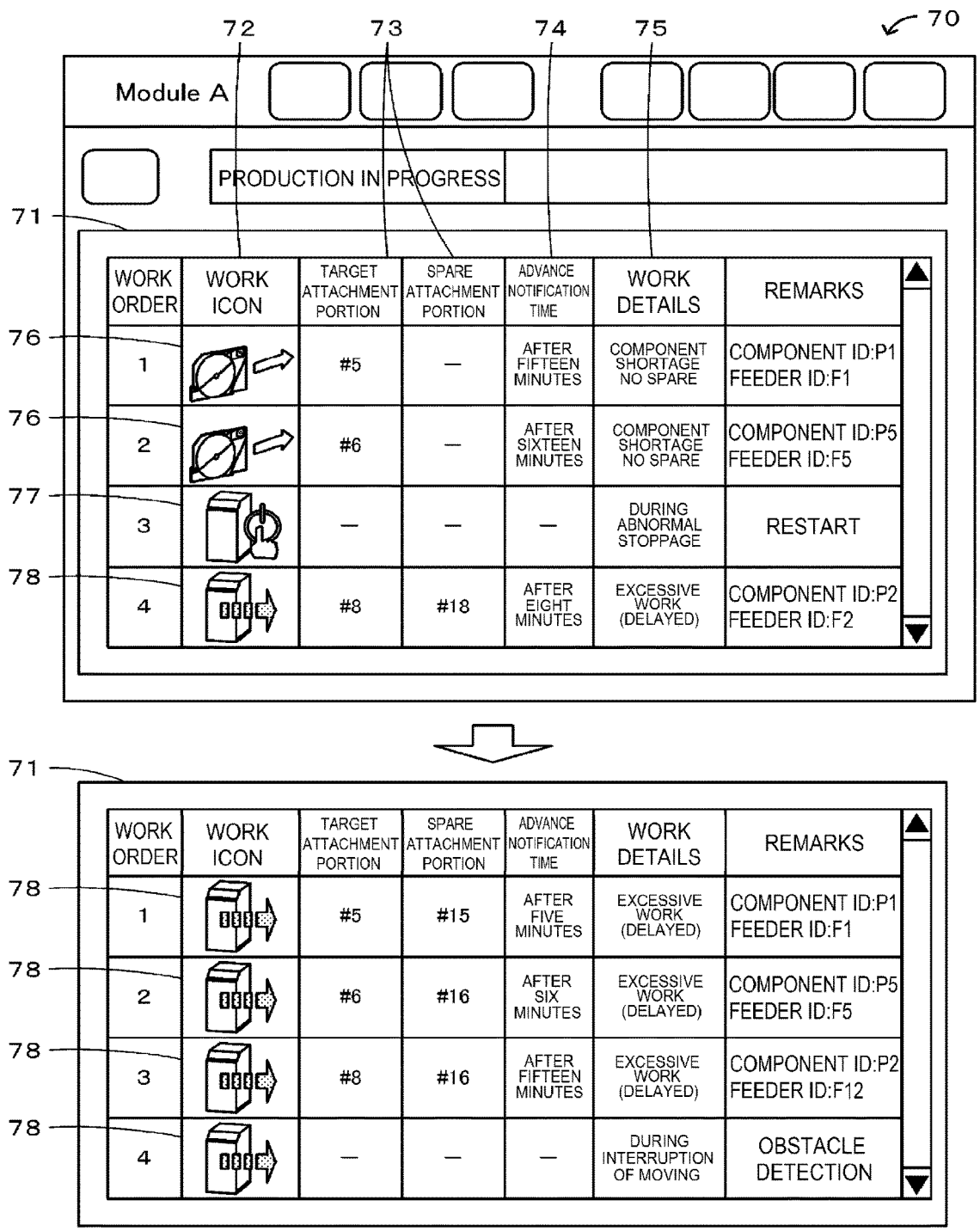
FIG. 5 is an explanatory diagram illustrating an example of notification screen 70 displayed on operation panel 28.

Mounting device 15 that has acquired the notification information output in S150 outputs the notification information to operation panel 28 to be displayed. FIG. 5 is an explanatory diagram illustrating an example of notification screen 70 displayed on operation panel 28 in the operator assistance mode. Notification screen 70 is a screen displaying work details for assisting loader 18, and includes notification information display field 71. In notification information display field 71, state display field 72, attachment portion display field 73, schedule display field 74, comment display field 75, and the like are disposed. State display field 72 is a field in which icons including one or more of provision icon 76, abnormality icon 77, and delay icon 78 are displayed as work states. Provision icon 76 is an icon indicating a state in which there is no spare feeder 25 in the attachment portion and a provision operation for feeder 25 is required. Abnormality icon 77 is an icon indicating an abnormality state of loader 18, such as a non-start state or abnormally stopped state of loader 18. Delay icon 78 is an icon indicating a work delay state of loader 18 caused by an excessive work state or a movement interruption of loader 18. Attachment portion display field 73 is a field for displaying a position of the work target attachment portion where feeder 25 is to be replaced and a position of the spare attachment portion where spare feeder 25 is served in advance. In attachment portion display field 73, slot numbers of storage section 13, buffer attachment portion 27, and the like are displayed. Schedule display field 74 is a field in which an advance notification time for executing work is displayed. Comment display field 75 is a field for displaying a comment of the work details. The work details include, for example, work for preparation without spare feeder 25, work for dealing with the non-start or the abnormal stoppage of loader 18, a manual exchange operation for feeder 25 for alleviating excessive work of loader 18, removal of an obstacle for dealing with the interruption of movement of loader 18, or a manual exchange operation for feeder 25. In notification information display field 71, the work details are displayed from the top according to the priority order in priority information 44.

Here, the processes in S140 to S150, work of operator M, and the like will be described by using work list information 45 in FIG. 3 and notification screen 70 in FIG. 5 as specific examples. First, CPU 41 acquires, for example, the work details as illustrated in work list information 45 in FIG. 3, and work numbers 1, 4, 5, 6, . . . are extracted from among the work details as work details that are substitutable by operator M. The work details of the work Nos. 1 and 2 are excluded since loader 18 immediately performs the work.

Next, CPU 41 performs a process of performing switching of the display order of the work details based on priority information 44. For example, in priority information 44, the priority order of the work numbers 5 and 6 in FIG. 3 is high, the priority order of the work number 1 is high, and the next is the work number 4. In notification information display field 71, the work details are displayed in this priority order. Operator M checks notification information display field 71, and performs, for example, the work in order from the work details displayed at the top. For example, operator M prepares feeder 25 having feeder ID F1, attaches feeder 25 to the attachment portion #15, attaches feeder 25 having feeder ID F5 to the attachment portion #16, and restarts loader 18. An example after 10 minutes is illustrated in the lower portion of FIG. 5. For example, after 10 minutes, operator M can confirm from the displayed details of notification information display field 71 that a delay occurs due to the excessive work of loader 18, and that exchange operations for feeders 25 having the feeder IDs=F1, F5, and F12 are delayed. Operator M can assist manual exchange of these feeders 25, remove obstacles, or the like.

Figure 6:
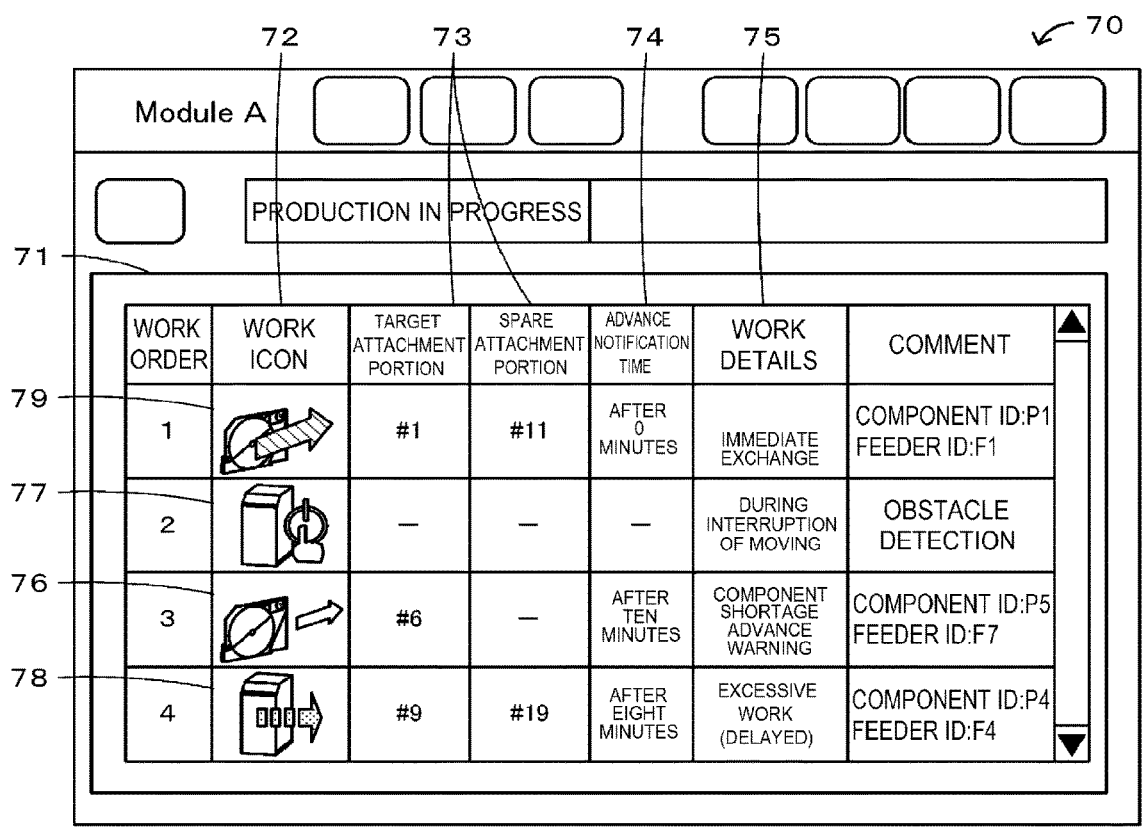
FIG. 6 is an explanatory diagram illustrating an example of notification screen 70 displayed on operation panel 28.

Next, a notification process in the work sharing mode in which an exchange operation of loader 18 and an exchange operation of operator M are independently assigned will be described. Also in this mode, the cooperative work notification process routine in FIG. 4 may be executed except for reading a priority order corresponding to the work sharing mode from priority information 44 in S150. In the work sharing mode, the work details are displayed in notification information display field 71 in the priority order indicated by priority information 44 in FIG. 3. FIG. 6 is an explanatory diagram illustrating an example of notification screen 70 displayed on operation panel 28 in the work sharing mode. In the work sharing mode, immediate icon 79 indicating a state in which a component shortage has occurred and immediate exchange of feeder 25 is required is displayed in state display field 72. Provision icon 76 is displayed in state display field 72 in an advance notification of the component shortage. Even in the work sharing mode, the work details are displayed in notification information display field 71 in a priority order in which each device of mounting system 10 can continue the process. Operator M can check notification information display field 71 to recognize work to be preferentially performed.

Here, correspondences between the constituents of the present embodiment and constituents of the present disclosure will be clarified. Management control section 40 of the present embodiment corresponds to a control section of the present disclosure, management PC 14 corresponds to an information processing device, and loader 18 corresponds to a mobile work device. Printing device 11, print inspection device 12, storage section 13, mounting device 15, and the like correspond to mounting-related devices, operation panel 28 corresponds to a display section, mounting attachment portion 26, buffer attachment portion 27, and the attachment portion of storage section 13 correspond to attachment portions, and board S corresponds to a processing target object. In the present embodiment, an example of the information processing method of the present disclosure is also clarified by describing the operations of management PC 14 and mounting device 15.

In management PC 14 of the present embodiment described above, notification screen 70 including notification information including work details that are substitutable by operator M in association with a status of loader 18 is output to operation panel 28 based on a predetermined priority order based on the continuation of a process of mounting device 15. Operator M can perform work by checking notification screens 70 arranged in the priority order. Therefore, in management PC 14, operator M can prompt cooperative work including replacement by operator M and replacement by loader 18. In the operator assistance mode, since the notification information includes impossible information, stop information, delay information, and interruption information and the priority order is in this order, operator M can prompt the cooperative work between operator M and loader 18 based on the priority order. In the work sharing mode, since the notification information includes immediate exchange information, abnormality information, warning information, and delay information, and the priority orders are in this order, operator M can prompt cooperative work between operator M and loader 18 based on the priority order.

Since management control section 40 displays and outputs causes notification screen 70 including state display field 72 including provision icon 76, abnormality icon 77, and delay icon 78, attachment portion display field 73, schedule display field 74, and comment display field 75 as notification information, operator M can prompt the cooperative work between operator M and loader 18 by checking these display fields. Since management control section 40 causes mounting device 15 having the attachment portion corresponding to the notification information output the notification information to be displayed, it is easy for operator M to ascertain the work details in mounting device 15. Since management control section 40 outputs the work details after a predetermined time during which loader 18 cannot start work at a scheduled work time to be displayed as notification information, operator M can perform the previous work ahead of a work status of loader 18. Therefore, management control section 40 can further achieve cooperative work with loader 18.

Needless to say, the present disclosure is not limited to the embodiment that has been described heretofore in any way and may be implemented in various forms without departing from the technical scope of the present disclosure.

For example, in the above embodiment, priority information 44 includes a priority order according to the operator assistance mode and the work sharing mode, but is not particularly limited to this, and either mode may be omitted such that a priority order thereof is omitted, or may include another mode such as a mode in which the operator assistance mode and the work sharing mode are merged, for example, and a priority order corresponding to the mode may be set.

In the above embodiment, in the operator assistance mode, the notification information includes impossible information, stop information, delay information, and interruption information in this priority order, but one or more thereof may be omitted, or other information may be further added or the priority order may be changed. In the work sharing mode, the notification information includes immediate exchange information, abnormality information, warning information, and delay information in this priority order, but one or more of them may be omitted, or other information may be further added or the priority order may be changed. The information or the priority order used in mounting system 10 may be appropriately set such that the processing in mounting system 10 can be further continued.

In the above embodiment, notification screen 70 includes state display field 72, attachment portion display field 73, schedule display field 74, and comment display field 75, but is not particularly limited to this, and one or more thereof may be omitted, or other display fields, for example, an error code display field may be provided. Notification screen 70 may be appropriately changed to facilitate understanding of work details.

In the above embodiment, only the work details executed by mounting device 15 other than the work details for loader 18 are displayed on operation panel 28, but the present disclosure is not particularly limited to this, and work details for other mounting devices 15 may be displayed. It is preferable to display only work to be executed by mounting device 15 on operation panel 28 in order to further reduce a work error of operator M.

In the above embodiment, the function of the information processing device of the present disclosure has been described as being provided in management PC 14, but the function of the information processing device of the present disclosure is not particularly limited to this, and may be provided in a mounting-related device such as mounting device 15, may be provided in loader 18, or may be provided in host PC 60. Also with this configuration, in mounting system 10, it is possible to prompt operator M to perform cooperative work between operator M and loader 18.

In the above embodiment, mounting device 15 has been mainly described as the mounting-related device of the present disclosure, but the present disclosure is not particularly limited to this, and a display section may be provided on printing device 11, print inspection device 12, a mounting inspection device (not illustrated), a reflow device, or the like to display work details that are substitutable by operator M. In the above embodiment, loader 18 has been described as performing automatic attachment and detachment of feeder 25, but is not particularly limited to this, and may perform automatic attachment and detachment of members to be attached to printing device 11, print inspection device 12, a mounting inspection device (not illustrated), a reflow device, or the like, and may output work details thereof to be displayed on notification screen 70.

In the above embodiments, the present disclosure has been described as mounting system 10, management PC 14, and mounting device 15, but the present disclosure may be an information processing method executed by management PC 14 or a program for realizing the information processing method.

Here, the information processing device and the information processing method of the present disclosure may be configured as follows. For example, in the information processing device of the present disclosure, the notification information may include one or more of (1) to (4), and the priority order may be the order of (1) to (4) among pieces of existing information. In this information processing device, the operator can prompt cooperative work between the operator and the moving work device based on the priority orders of the stop information, the delay information, the interruption information, and the like. (1) The impossible information that a spare member is absent in the spare attachment portion and the moving work device is inoperable in the moving work device configured to be able to attach and detach the member to and from a spare attachment portion (2) The stop information regarding stoppage of the moving work device (3) The delay information regarding a work delay of the moving work device (4) The interruption information regarding interruption of movement of the moving work device In the information processing device of the present disclosure, the notification information may include one or more of (5) to (8), and the priority may be the order of (5) to (8) among pieces of existing information. In this information processing device, the operator can prompt the cooperative work between the operator and the moving work device based on the priority orders of the immediate exchange information, the abnormality information, the warning information, the delay information, and the like. (5) The immediate exchange information regarding an exchange operation for the member by the operator (6) The abnormality information regarding an abnormality of the moving work device (7) The warning information regarding an advance warning of the exchange operation for the member by the operator (8) The delay information regarding a work delay of the moving work device In the information processing device of the present disclosure, the control section may output a notification screen including one or more of a state display field including one or more of a member provision icon, an abnormality icon, and a delay icon, an attachment portion display field including at least a position of a work target attachment portion to which a spare member is to be attached and a position of a spare attachment portion in which a spare member is served in advance, a comment display field displaying a comment on work details, and a schedule display field including an advance notification time for executing work, to the display section to be displayed as the notification information. In this information processing device, the operator can prompt the cooperative work between the operator and the moving work device by checking the state display field, the attachment portion display field, the comment display field, the schedule display field, and the like.

In the information processing device of the present disclosure, the control section may output the notification information to only a mounting-related device having an attachment portion corresponding to the notification information among the mounting-related devices to be displayed. In this information processing device, since the notification information is displayed on the display section of the mounting-related device corresponding to the notification information, it is easy for the operator to ascertain the work details in the device.

In the information processing device of the present disclosure, the control section may output work details after a predetermined time during which the moving work device cannot start work at a scheduled work time to the display section to be displayed as the notification information. In this information processing device, since the notification information including work details required to continue a process of the mounting-related device is displayed after the predetermined time, the operator can perform the previous work ahead of a work status of the moving work device. Therefore, in this information processing device, it is possible to further achieve cooperative work with the moving work device.

In the information processing device of the present disclosure, the mounting system may include a management device that manages the moving work device, and at least one of the mounting-related device, the moving work device, and the management device may include the information processing device described above. In this information processing device, the operator can prompt the cooperative work between the operator and the moving work device from any of the devices included in the mounting system.

The information processing method of the present disclosure is an information processing method used in a mounting system including multiple mounting-related devices each having a display section that visually notifies an operator of information and an attachment portion to which a member is attached and related to a process of mounting a component on a processing target object, and a moving work device that is moved between the multiple mounting-related devices to automatically attach and detach the member to and from the attachment portion, the information processing method including a step of outputting, to the display section, notification information including work details that are substitutable by the operator in association with a status of the moving work device based on a predetermined priority order.

In this information processing method, similarly to the information processing device described above, the operator can prompt the cooperative work including replacement by the operator and replacement by the moving work device. The information processing method may employ the aspect of the information processing device described above, or may include a step of realizing the function of the information processing device described above.

INDUSTRIAL APPLICABILITY

The information processing device and the information processing method of the present disclosure can be used in the field of mounting electronic components.

REFERENCE SIGNS LIST 10 mounting system, 11 printing device, 12 print inspection device, 13 storage section, 14 management PC, 15 mounting device, 16 automatic conveyance vehicle, 18 loader, 19 X-axis rail, 23 board processing section, 24 component supply section, 25 feeder, 26 mounting attachment portion, 27 buffer attachment portion, 28 operation panel, 30 mounting section, 31 head moving section, 32 mounting head, 33 nozzle, 34 communication section, 36 mounting control section, 37 CPU, 38 memory portion, 39 mounting management information, 40 management control section, 41 CPU, 43 memory section, 44 priority information, 45 work list information, 46 instruction list, 47 communication section, 50 moving control section, 51 CPU, 53 memory section, 54 accommodation section, 55 exchange section, 56 moving section, 57 communication section, 60 host PC, 70 notification screen, 71 notification information display field, 72 state display field, 73 attachment portion display field, 74 schedule display field, 75 comment display field, 76 provision icon, 77 abnormality icon, 78 delay icon, 79 immediate icon, P component, S board

The invention claimed is:

1. An information processing device used in a mounting system including multiple mounting-related devices each having a display section configured to visually notify an operator of information and an attachment portion to which a member is attached and related to a process of mounting a component on a processing target object, and a moving work device that is moved between the multiple mounting-related devices to automatically attach and detach the member to and from the attachment portion, the information processing device comprising:
a control section configured to output, to the display section, notification information including work details that are substitutable by the operator in association with a status of the moving work device based on a predetermined priority order based on continuation of processes of the mounting-related devices.

2. The information processing device according to claim 1, wherein
the notification information includes one or more of (1) to (4), and
the priority order is an order of (1) to (4) among pieces of existing information:
(1) impossible information that a spare member is absent in a spare attachment portion and the moving work device is inoperable in the moving work device configured to attach and detach the member to and from the spare attachment portion,
(2) stop information regarding stoppage of the moving work device,
(3) delay information regarding a work delay of the moving work device, and
(4) interruption information regarding interruption of movement of the moving work device.

3. The information processing device according to claim 1, wherein
the notification information includes one or more of (5) to (8), and
the priority order is an order of (5) to (8) among pieces of existing information:
(5) immediate exchange information regarding an exchange operation for the member by the operator,
(6) abnormality information regarding an abnormality of the moving work device,
(7) warning information regarding an advance warning of the exchange operation for the member by the operator, and
(8) delay information regarding a work delay of the moving work device.

4. The information processing device according to claim 1, wherein
the control section outputs a notification screen including one or more of a state display field including one or more of a member provision icon, an abnormality icon, and a delay icon, an attachment portion display field including at least a position of a work target attachment portion to which a spare member is to be attached and a position of a spare attachment portion in which a corresponding spare member is served in advance, a comment display field displaying a comment on work details, and a schedule display field including an advance notification time for executing work, to the display section to be displayed as the notification information.

5. The information processing device according to claim 1, wherein
the control section outputs the notification information to only a mounting-related device having an attachment portion corresponding to the notification information among the mounting-related devices to be displayed.

6. The information processing device according to claim 1, wherein
the control section outputs work details after a predetermined time during which the moving work device cannot start work at a scheduled work time to the display section to be displayed as the notification information.

7. The information processing device according to claim 1, wherein
the mounting system includes a management device configured to manage the moving work device, and
one or more of the mounting-related device, the moving work device, and the management device include the information processing device.

8. An information processing method used in a mounting system including multiple mounting-related devices each having a display section configured to visually notify an operator of information and an attachment portion to which a member is attached and related to a process of mounting a component on a processing target object, and a moving work device that is moved between the multiple mounting-related devices to automatically attach and detach the member to and from the attachment portion, the information processing method comprising:
    a step of outputting, to the display section, notification information including work details that are substitutable by the operator in association with a status of the moving work device based on a predetermined priority order.

* * * * *